(12) United States Patent
Wada

(10) Patent No.: US 9,088,064 B2
(45) Date of Patent: Jul. 21, 2015

(54) NON-RECIPROCAL CIRCUIT ELEMENT

(71) Applicant: Murata Manufacturing Co., Ltd., Nagaokakyo-shi, Kyoto-fu (JP)

(72) Inventor: Takaya Wada, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/633,460

(22) Filed: Feb. 27, 2015

(65) Prior Publication Data
US 2015/0171499 A1    Jun. 18, 2015

Related U.S. Application Data

(63) Continuation of application No. PCT/JP2013/070447, filed on Jul. 29, 2013.

(30) Foreign Application Priority Data

Aug. 28, 2012 (JP) ................. 2012-187452

(51) Int. Cl.
| H01P 1/36 | (2006.01) |
| H01P 1/365 | (2006.01) |
| H01P 1/203 | (2006.01) |
| H03H 7/01 | (2006.01) |
| H04B 1/40 | (2015.01) |
| H01P 1/32 | (2006.01) |

(52) U.S. Cl.
CPC ............... *H01P 1/365* (2013.01); *H01P 1/203* (2013.01); *H01P 1/32* (2013.01); *H01P 1/36* (2013.01); *H03H 7/0138* (2013.01); *H04B 1/40* (2013.01)

(58) Field of Classification Search
CPC ............ H01P 1/32; H01P 1/383; H01P 1/36; H01P 1/38
USPC .................................................. 333/1.1, 24.2
See application file for complete search history.

(56) References Cited

U.S. PATENT DOCUMENTS

2007/0030089 A1  2/2007  Hino
2011/0204989 A1  8/2011  Wada

FOREIGN PATENT DOCUMENTS

JP   4155342 B2   9/2008
JP   4197032 B2   12/2008
(Continued)

OTHER PUBLICATIONS

Official Communication issued in International Patent Application No. PCT/JP2013/070447, mailed on Oct. 8, 2013.
(Continued)

*Primary Examiner* — Stephen E Jones
(74) *Attorney, Agent, or Firm* — Keating & Bennett, LLP

(57) ABSTRACT

A non-reciprocal circuit element includes high-pass-type first and second isolators, which are each provided with first and second central electrodes that are arranged on a ferrite so as to cross each other while being insulated from each other, the ferrite being applied with a direct-current magnetic field by permanent magnets. One end of the first central electrode defines an input port and another end of the first central electrode defines an output port, and one end of the second central electrode defines the input port and another end of the second central electrode defines a ground port. A pass frequency band of the first isolator is higher than a pass frequency band of the second isolator. Inputs of the isolators are electrically connected to each other to define a single input terminal IN and a low-pass filter LPF is provided between the input terminal IN and the input port of the second isolator.

12 Claims, 12 Drawing Sheets

(56) References Cited

FOREIGN PATENT DOCUMENTS

| | | |
|---|---|---|
| JP | 2011-176668 A | 9/2011 |
| JP | 5679056 B2 | 3/2015 |
| WO | 2012/172882 A1 | 12/2012 |

OTHER PUBLICATIONS

Official Communication issued in corresponding Japanese Patent Application No. 2014-532888, mailed on Jan. 27, 2015.

M1: 824.00 MHz
     -18.670 dB
     -18.635 dB
M2: 869.50 MHz
     -20.545 dB
     -20.456 dB
M3: 915.00 MHz
     -20.755 dB
     -20.643 dB
M4: 1710.00 MHz
     -19.673 dB
     -19.689 dB
M5: 1845.00 MHz
     -27.671 dB
     -26.830 dB
M6: 1980.00 MHz
     -16.060 dB
     -15.937 dB

M1: 824.00 MHz
     -27.672 dB
     -13.094 dB
M2: 869.50 MHz
     -26.345 dB
     -10.582 dB
M3: 915.00 MHz
     -25.128 dB
     -11.156 dB
M4: 1710.00 MHz
     -10.485 dB
     -20.766 dB
M5: 1845.00 MHz
     -9.759 dB
     -21.848 dB
M6: 1980.00 MHz
     -10.474 dB
     -22.789 dB

M1: 824.00 MHz
     -27.565 dB
     -0.647 dB
M2: 869.50 MHz
     -26.211 dB
     -0.638 dB
M3: 915.00 MHz
     -24.959 dB
     -0.691 dB
M4: 1710.00 MHz
     -0.780 dB
     -20.581 dB
M5: 1845.00 MHz
     -0.570 dB
     -21.462 dB
M6: 1980.00 MHz
     -0.687 dB
     -22.160 dB

```
M1:824.00 MHz
      -0.125 dB
     -26.661 dB
M2:869.50 MHz
      -0.145 dB
     -28.089 dB
M3:915.00 MHz
      -0.171 dB
     -19.692 dB
M4:1710.00 MHz
     -14.660 dB
      -1.118 dB
M5:1845.00 MHz
     -39.453 dB
      -1.140 dB
M6:1980.00 MHz
     -20.125 dB
      -1.027 dB
```

```
M1:824.00 MHz
     55.078 ohm
    -11.220 ohm
M2:869.50 MHz
     50.367 ohm
     -9.457 ohm
M3:915.00 MHz
     45.354 ohm
     -7.430 ohm
M4:1710.00 MHz
     42.777 ohm
     -6.412 ohm
M5:1845.00 MHz
     47.911 ohm
      3.469 ohm
M6:1980.00 MHz
     55.488 ohm
     15.870 ohm
```

M1: 824.00 MHz
    1.453 ohm
    -86.939 ohm
M2: 869.50 MHz
    1.491 ohm
    -80.071 ohm
M3: 915.00 MHz
    1.561 ohm
    -73.731 ohm
M4: 1710.00 MHz
    34.435 ohm
    1.293 ohm
M5: 1845.00 MHz
    49.100 ohm
    -0.547 ohm
M6: 1980.00 MHz
    59.413 ohm
    -5.291 ohm

NON-RECIPROCAL CIRCUIT ELEMENT

BACKGROUND OF THE INVENTION

1. Field of the Invention

The present invention relates to non-reciprocal circuit elements and in particular relates to non-reciprocal circuit elements such as isolators and circulators preferably for use in microwave bands.

2. Description of the Related Art

In the related art, non-reciprocal circuit elements such as isolators and circulators have a characteristic that they transmit a signal only in a specific predetermined direction and do not transmit a signal in the opposite direction. For example, isolators employ this characteristic when used in a transmission circuit section of a mobile communication apparatus such as a cellular phone.

As described in Japanese Patent No. 4197032 and Japanese Patent No. 4155342, examples of a two-port isolator used as such a non-reciprocal circuit element are known and have a basic configuration in which a first central electrode and a second central electrode are arranged on the surface of a ferrite so as to cross each other while being insulated from each other, a resistor is connected between one end of the first central electrode connected to an input port and one end of the second central electrode connected to an output port, and a capacitor is connected in parallel with the resistor. In both examples, improvements in insertion loss and isolation characteristics are achieved.

Meanwhile, in recent years, communication in a plurality of frequency bands using a single cellular phone has become possible. In order to achieve this, in the related art, a single isolator has been used for each frequency band and therefore the number of components has increased. Consequently, a non-reciprocal circuit element that can be used in a plurality of frequency bands has been demanded. In short, a non-reciprocal circuit element that has a single input but at least two outputs for outputting signals of a plurality of frequency bands has been demanded.

The present inventors conceived of forming a single non-reciprocal circuit element to be used in a plurality of frequency bands by combining a pair of the two-port isolators described in Japanese Patent No. 4197032 or Japanese Patent No. 4155342. This two-port isolator is a high-pass-type isolator and as illustrated in FIG. 15 when a combination is formed that operates at frequencies f1 and f2, a harmonic band of the frequency f2 is superposed with the frequency f1 and therefore the quality of communication is poor.

Furthermore, the present inventors proposed the non-reciprocal circuit element described in Japanese Unexamined Patent Application Publication No. 2011-176668 that is intended to suppress increases in the number of components and insertion loss as much as possible while being capable of achieving good operation in a plurality of frequency bands.

This non-reciprocal circuit element, as illustrated in FIG. 16, is formed by combining a first isolator 100 and a second isolator 200 and each of the isolators 100 and 200 is configured as a high-pass isolator that is provided with a first central electrode 135 (inductors L1H and L1L respectively) and a second central electrode 136 (inductors L2H and L2L respectively) arranged on a ferrite 132, which is applied with a direct-current magnetic field from a permanent magnet (not illustrated), so as to cross each other while being insulated from each other. The pass frequency band of the first isolator 100 is set so as to be higher than the pass frequency band of the second isolator 200 and inputs of the first isolator 100 and the second isolator 200 are electrically connected to each other to form a single input terminal IN and their outputs form output terminals OUT1 and OUT2. In addition, a low-pass filter LPF is provided between the input terminal IN and the input of the second isolator 200.

The non-reciprocal circuit element illustrated in FIG. 16 has the single input terminal IN formed by electrically connecting the inputs of the first isolator 100 and the second isolator 200 and functions as a single non-reciprocal circuit element. Furthermore, since the low-pass filter LPF is provided between the input terminal IN and the input of the second isolator 200, a harmonic band of the second isolator 200, which has a low pass frequency band, is attenuated and interference with the first isolator 100, which has a high pass frequency band, is prevented. In addition, the low-pass filter LPF is provided at a single location between the input terminal IN and the input of the second isolator 200 and therefore an increase in insertion loss and an increase in the number of components are suppressed.

In more detail, in the isolators 100 and 200, in order to reduce insertion loss, one end of each of the first central electrodes 135 forms an input port P1 and the other end of each of the first central electrodes 135 forms an output port P2, one end of each of the second central electrodes 136 also forms the output port P2 and the other end of each of the second central electrodes 136 forms a ground port P3, a resistor R1H and a capacitor C1H, which are connected in parallel with each other, and a resistor R1L and a capacitor C1L, which are connected in parallel with each other, are connected between the respective input ports P1 and output ports P2, and capacitors C2H and C2L are connected in parallel with the respective second central electrodes 136. The first central electrode 135 and the capacitor C1H or C1L form a resonant circuit and the second central electrode 136 and the capacitor C2H or C2L form a resonant circuit. In addition, capacitors CS1H and CS2H and CS1L and CS2L are connected to sides of the input port P1 and the output port P2 in order to adjust impedance.

The non-reciprocal circuit element composed of the isolators 100 and 200 is incorporated into a transmission circuit of a cellular phone. That is, the input terminal IN is connected to a transmission-side power amplifier PA via matching circuits 60 and 70 and the output terminals OUT1 and OUT2 are connected to an antenna via a duplexer or the like.

Usually, the output impedance of the power amplifier PA is low at around 5Ω and the input impedance of the isolators 100 and 200 is high at around 50Ω. It is possible to reduce the input impedances of the isolators 100 and 200 by reducing the crossing angle of the first central electrode 135 and the second central electrode 136, but there is a limit to how much the crossing angle can be reduced (how much the input impedance can be reduced) due to the demand for size reduction of the isolators 100 and 200.

Consequently, the matching circuit 60, which is composed of an inductor L13 and a capacitor C14, and the matching circuit 70, which is composed of an inductor L14 and a capacitor C15, are interposed between the isolators 100 and 200 and the power amplifier PA to make the impedances gradually increase to 25Ω and then 50Ω to match the impedance of the isolators 100 and 200. However, interposing the matching circuits 60 and 70 leads to the insertion loss being increased and also the number of components and the cost of the transmission circuit being increased. Regarding the insertion loss, as illustrated in FIG. 16, in the isolator 100, an insertion loss of the matching circuits 60 and 70 of 0.8 dB is added to the insertion loss of the isolator 100 of 0.7 dB, resulting in a total of 1.5 dB. For the isolator 200, an insertion loss of the low-pass filter LPF of 0.3 dB and an insertion loss of the matching circuits 60 and 70 of 0.8 dB are added to the insertion loss of the isolator 200 of 0.7 dB, giving a total of 1.8 dB.

SUMMARY OF THE INVENTION

Accordingly, preferred embodiments of the present invention provide a non-reciprocal circuit element that is capable of operating in a plurality of frequency bands and is able to realize a low input impedance.

A non-reciprocal circuit element according to a preferred embodiment of the present invention includes high-pass-type first and second isolators that are each provided with first and second central electrodes that are arranged on a ferrite so as to cross each other while being insulated from each other, the ferrite being applied with a direct-current magnetic field by permanent magnets, one end of the first central electrode defining an input port and another end of the first central electrode defining an output port, one end of the second central electrode defining the input port and another end of the second central electrode defining a ground port, and a resistance element and a capacitance element, which are connected in parallel with each other, are connected in series between the input port and the output port.

A pass frequency band of the first isolator is higher than a pass frequency band of the second isolator.

Inputs of the first and second isolators are electrically connected to each other to define a single input terminal, and a low-pass filter is located between the input terminal and the input port of the second isolator.

The inductance of the second central electrode of the first and second isolators of the non-reciprocal circuit element is set to be larger than the inductance of the first central electrode and as a result when a high-frequency signal is input from the input port, a current flows through the first central electrode and is output from the output port without substantially any current flowing through the second central electrode and the resistance element. On the other hand, when a high-frequency signal is input from the output port, the high-frequency signal flows through the resistance element and is consumed as heat without passing through the first central electrode due to non-reciprocal operation. That is, the current is attenuated (isolated). The inductance of the second central electrode is relatively large and therefore the input impedance is reduced and it is possible to decrease the input impedance to around half that in the related art. Therefore, it is possible to omit or reduce the number of matching circuits interposed between a power amplifier and the isolators and consequently along with a reduction in the insertion loss of the transmission-side circuit, the number of components and the cost are also reduced.

In addition, the inputs of the first and second isolators of the non-reciprocal circuit element are electrically connected to each other to define a single input terminal and the non-reciprocal circuit element defines and functions as a single non-reciprocal circuit element. Furthermore, since the low-pass filter is provided between the input terminal and the input port of the second isolator, a harmonic band of the second isolator, which has a low pass frequency band, is attenuated and interference with the first isolator, which has a high pass frequency band, is prevented. In addition, the low-pass filter is provided at a single place between the input terminal and the input port of the second isolator and therefore an increase in insertion loss and an increase in the number of components are suppressed.

According to various preferred embodiments of the present invention, operation is possible in a plurality of frequency bands and a low input impedance is realized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, examples of a non-reciprocal circuit element according to preferred embodiments of the present invention will be described while referring to the accompanying drawings. In each of the drawings, like components and portions are denoted by the same symbols and repeated description thereof will be avoided.

First Preferred Embodiment

Figure 1:
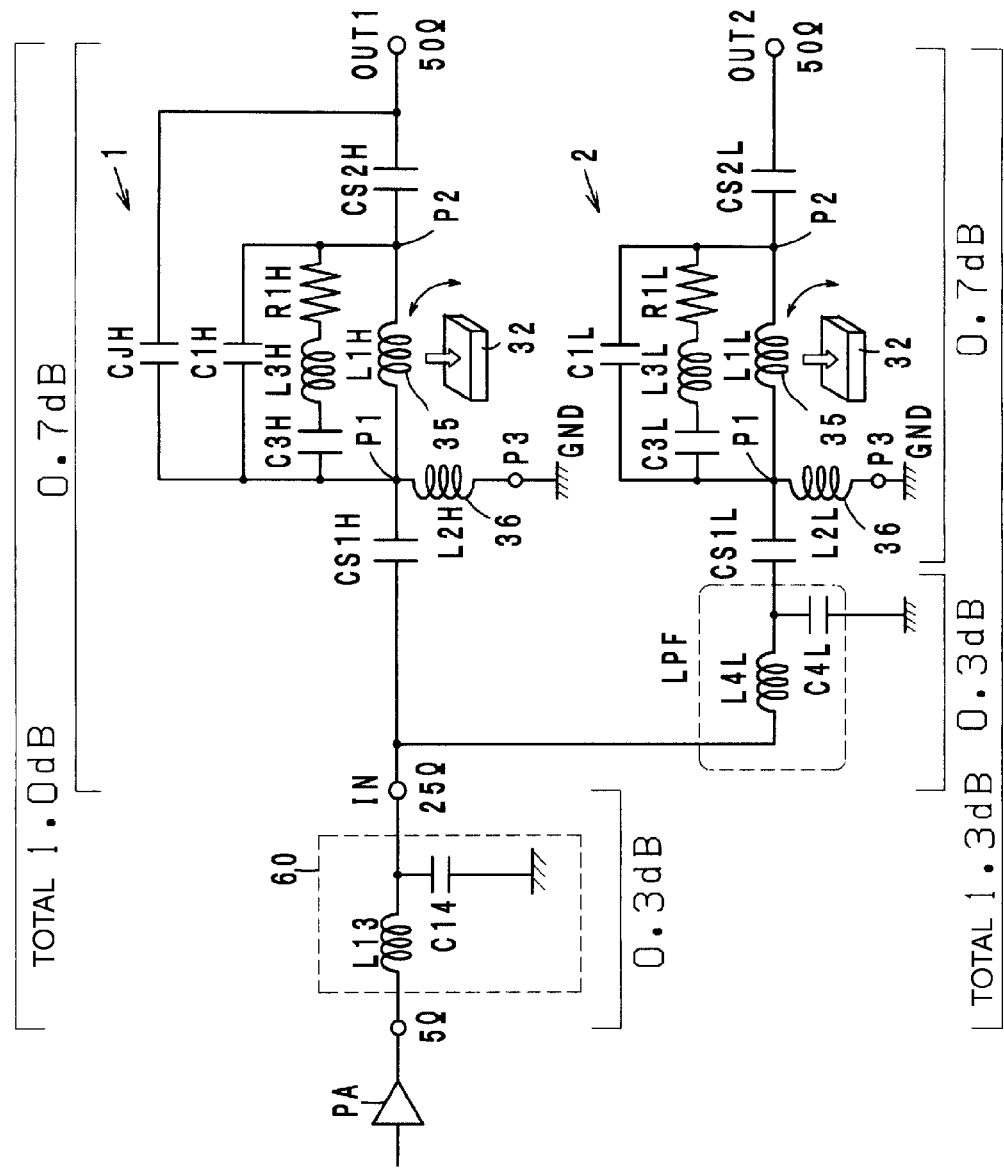
FIG. 1 is an equivalent circuit diagram illustrating a non-reciprocal circuit element according to a first preferred embodiment of the present invention.
Figure 2:
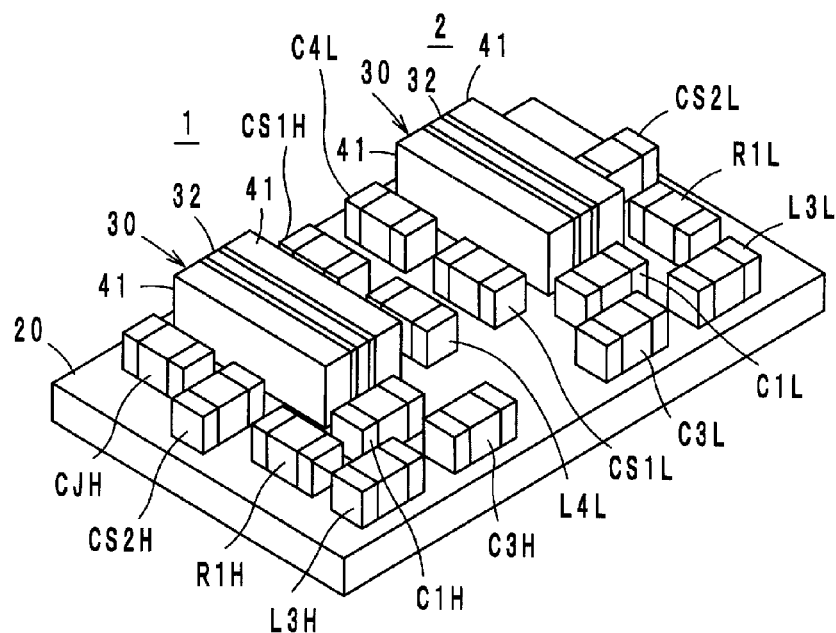
FIG. 2 is a perspective view illustrating the exterior of the non-reciprocal circuit element.

As illustrated in the equivalent circuit of FIG. 1, a non-reciprocal circuit element of a first preferred embodiment is configured preferably by integrating a two-port first isolator 1 and a two-port second isolator 2 into a single unit (refer to FIG. 2). The first isolator 1 and the second isolator 2 are each a concentrated constant isolator in which a first central electrode 35, which defines an inductor L1H or L1L, and a second central electrode 36, which defines an inductor L2H or L2L, are arranged on a microwave magnetic body (hereafter referred to as ferrite 32) so as to cross each other while being insulated from each other.

The isolators 1 and 2 are high-pass isolators and the pass frequency band of the first isolator 1 is set to be higher than the pass frequency band of the second isolator 2. The inputs of the first isolator 1 and the second isolator 2 are electrically connected to each other to define a single input terminal IN and the outputs of the first isolator 1 and the second isolator 2 define output terminals OUT1 and OUT2. In addition, a low-pass filter LPF is provided between the input terminal IN and the input of the second isolator 2 ("Input" means an input port P1. A capacitor CS1L preferably is provided at the input port P1 in this preferred embodiment.

Hereafter, the circuit configurations of the first isolator 1 and the second isolator 2 will be described while referring to FIG. 1. "H" is appended to the end of symbols representing circuit components in the first isolator 1 and "L" is appended to the end of symbols representing circuit components in the second isolator 2, and although the following description is made for the first isolator 1, the second isolator 2 has a similar configuration.

In the isolator 1, the first and second central electrodes 35 and 36 (inductors L1H and L2H) are arranged on the surface of the ferrite 32 so as to cross each other while being insulated from each other, the first and second central electrodes 35 and 36 are magnetically coupled with each other due to a direct-current magnetic field being applied from permanent magnets 41 (refer to FIG. 2 and FIG. 3) in the portion where the electrodes cross each other, one end of the first central electrode 35 defines an input port P1 and the other end of the first central electrode 35 defines an output port P2, and one end of the second central electrode 36 also defines the input port P1 and the other end of the second central electrode 36 defines a ground port P3. The input port P1 is connected to the input terminal IN via a matching capacitor CS1H and the output port P2 is connected to the output terminal OUT1 via a matching capacitor CS2H.

A matching capacitor C1H is connected in parallel with the first central electrode 35 between the input port P1 and the output port P2, and a resistor R1H and an LC series resonant circuit (including an inductor L3H and a capacitor C3H) are connected in parallel with the first central electrode 35. A capacitor CJH is further connected between the input port P1 and the output terminal OUT1. The capacitor CJH is configured to adjust insertion loss and isolation. However, the capacitor CJH is omitted from the second isolator 2.

The non-reciprocal circuit element is incorporated into a transmission circuit of a cellular phone. That is, the input terminal IN is connected to a transmission-side power amplifier PA via a matching circuit 60 and the output terminals OUT1 and OUT2 are connected to an antenna via a duplexer or the like.

Figure 16:
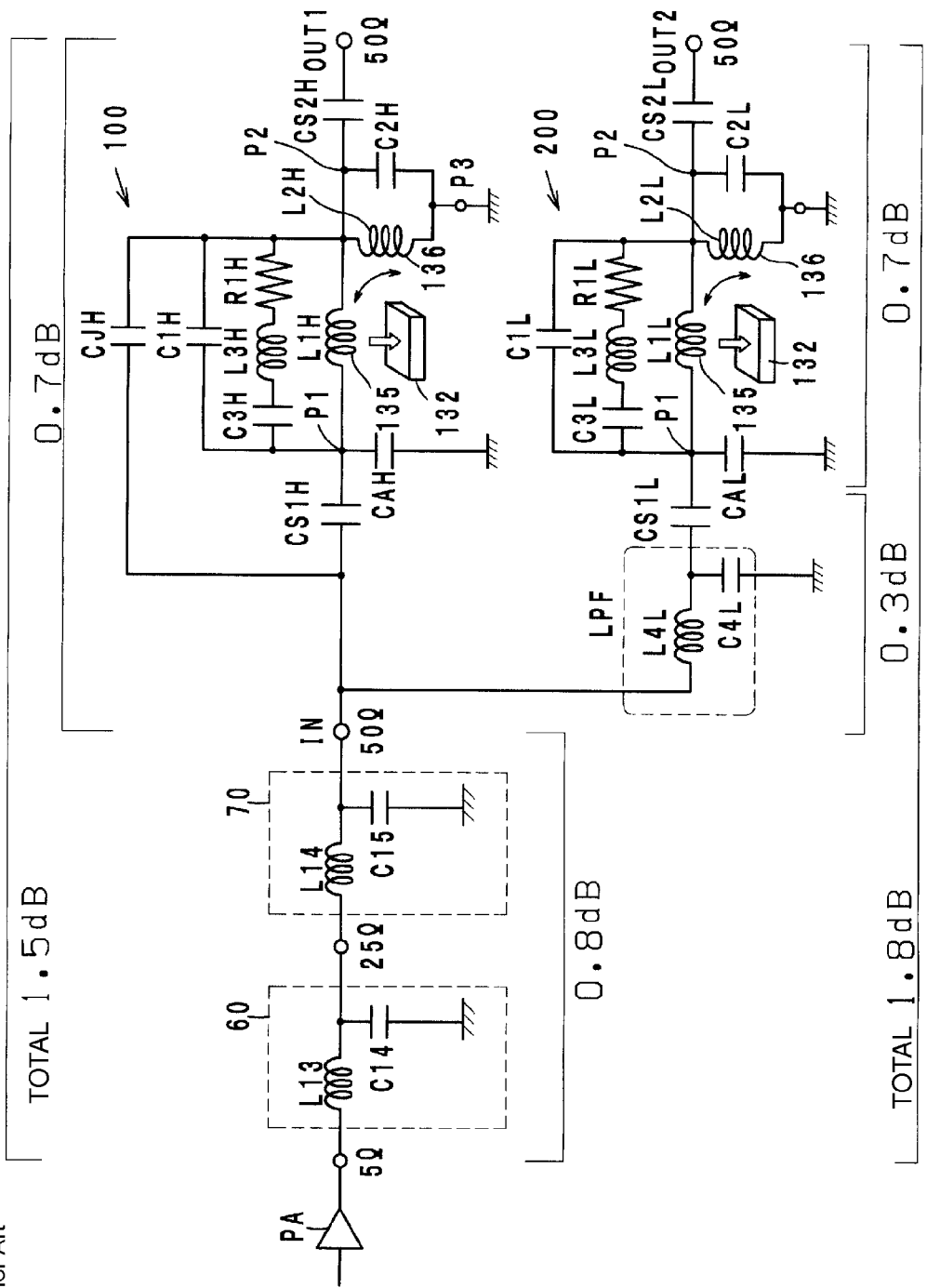
FIG. 16 is an equivalent circuit diagram of a transmission-side circuit including an isolator of the related art.

In the isolators 1 and 2, the inductance of the second central electrode 36 is set so as to be larger than the inductance of the first central electrode 35 and therefore when a high-frequency signal is input from the input port P1, a current flows through the first central electrode 35 and is output from the output port P2 substantially without flowing through the second central electrode 36 and the resistor R1H. On the other hand, when a high-frequency signal is input from the output port P2, the high-frequency signal flows through the resistor R1H and is consumed as heat without passing through the first central electrode 35 due to non-reciprocal operation. That is, the current is attenuated (isolated). The inductance of the second central electrode 36 is relatively large and therefore the input impedance is reduced and it is possible to decrease the input impedance to around half that in the related art. Thus, it is possible to omit or reduce the number of matching circuits interposed between the power amplifier PA and the isolators. Specifically, the matching circuit 70 illustrated in FIG. 16 can be omitted. Therefore, along with the insertion loss of the transmission-side circuit being reduced, the number of components and the cost are also reduced. In addition, it is no longer necessary to forcibly decrease the crossing angle between the first and second central electrodes 35 and 36 in order to reduce the input impedance.

In addition, at the time of an operation in which a signal is transmitted from the input port P1 to the output port P2, a high-frequency current substantially does not flow through the resistor R1H and the LC series resonant circuit (inductor L3H and capacitor C3H) and therefore loss due to the LC series resonant circuit can be ignored and insertion loss does not increase. On the other hand, when a high-frequency current is input to the output port P2, matching is performed over a wide band due to the impedance characteristic of the resistor R1H and the LC series resonant circuit and the isolation characteristic is improved.

Figure 5:
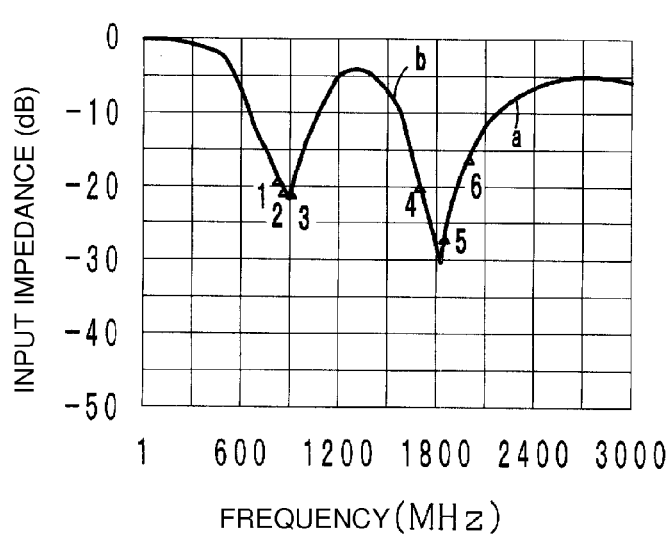
FIG. 5 is a graph illustrating an input impedance characteristic of the isolator.
Figure 6:
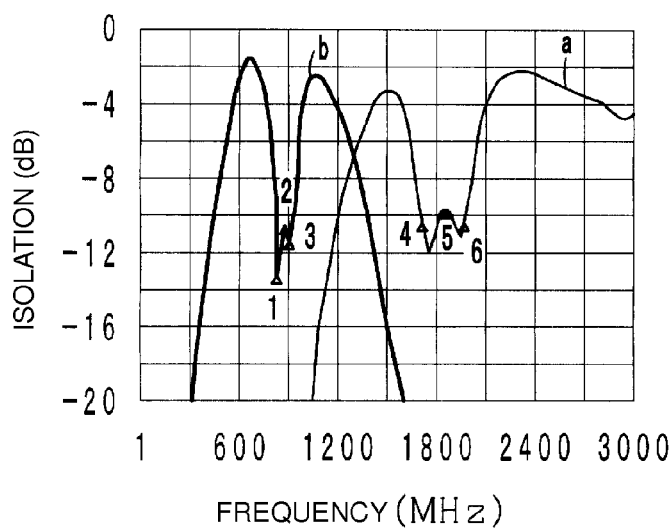
FIG. 6 is a graph illustrating an isolation characteristic of the isolator.

In this first preferred embodiment, a low-pass filter LPF is preferably provided between the input terminal IN and the input of the second isolator 2. This low-pass filter LPF preferably includes an L-type resonant circuit including an inductor L4L and a capacitor C4L. The input impedance characteristics of the isolators 1 and 2 realized by inserting the low-pass filter LPF are illustrated in FIG. 5, and curve a representing the input impedance characteristic of the first isolator 1 and curve b representing the impedance characteristic of the second isolator 2 almost entirely overlap each other such that they cannot be discriminated from each other. The isolation characteristics are illustrated in FIG. 6, where the isolation characteristic of the first isolator 1 is represented by curve a and the isolation characteristic of the second isolator 2 is represented by curve b.

Figure 7:
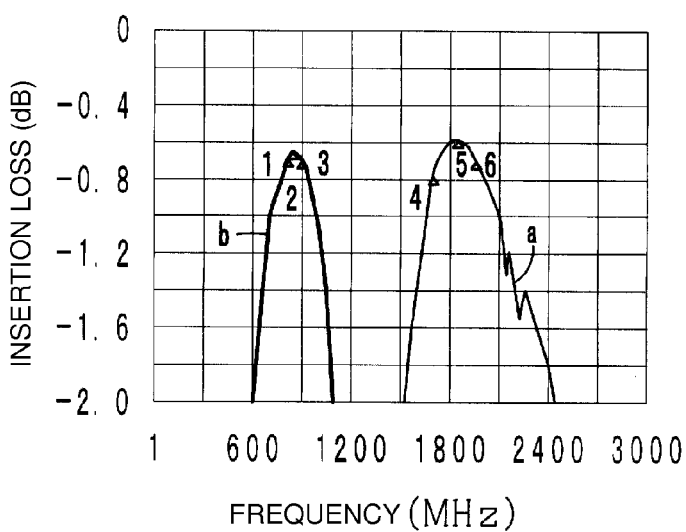
FIG. 7 is a graph illustrating an insertion loss characteristic of the isolator.
Figure 8:
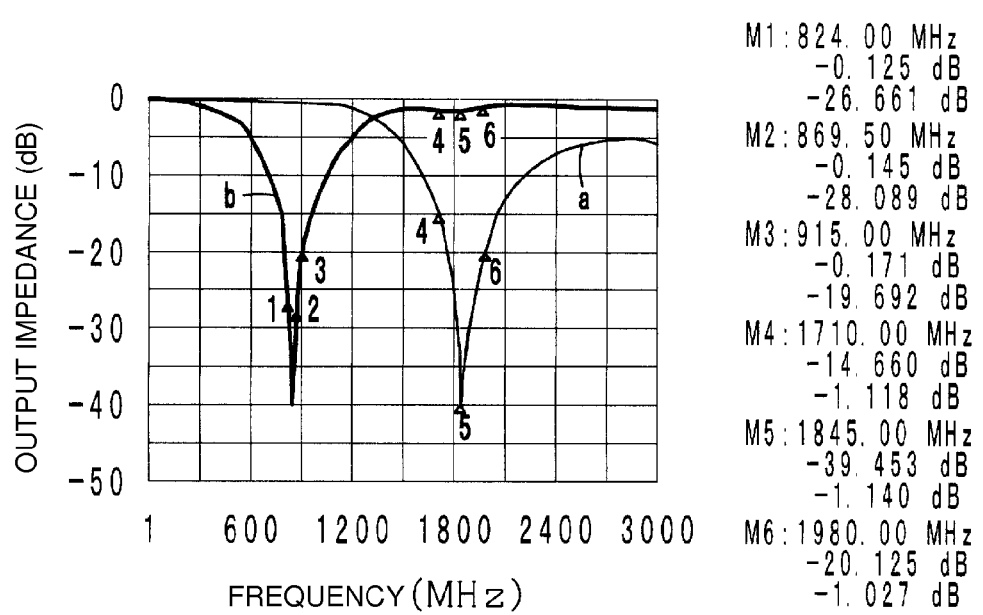
FIG. 8 is a graph illustrating an output impedance characteristic of the isolator.

The insertion loss characteristics are illustrated in FIG. 7, where the insertion loss characteristic of the first isolator 1 is represented by curve a and the insertion loss characteristic of the second isolator 2 is represented by curve b. The pass frequency band of the second isolator 2 is set to be lower than the pass frequency band of the first isolator 1 and although not illustrated in FIG. 7, a frequency band of the second isolator 2 is greatly attenuated over a band corresponding to the pass frequency band of the first isolator 1 due to the insertion of the low-pass filter LPF. In addition, the output impedance characteristics are illustrated in FIG. 8, where the output impedance characteristic of the first isolator is represented by curve a and the output impedance characteristic of the second isolator 2 is represented by a curve b.

In other words, a band corresponding to the frequency band of the first isolator 1 seen from a frequency band of the second isolator 2 is attenuated and as a result a substantially open end is achieved, and the electrical characteristics are not greatly degraded despite the inputs of the first and second isolators 1 and 2 being joined together. On the other hand, for the frequency band of the second isolator 2 seen from the frequency band of the first isolator 1, a substantially open end is achieved since the second isolator 2 is a high-pass isolator and therefore the joining of the isolators is not obstructed.

As described above, in the first preferred embodiment, the inputs of the first and second isolators 1 and 2 are electrically connected to each other to define a single input terminal IN and the first and second isolators are integrated to define a single non-reciprocal circuit element. Furthermore, since the low-pass filter LPF is provided between the input terminal IN and the input of the second isolator 2, a harmonic band of the second isolator 2, which has a low pass frequency band, is attenuated and interference with the first isolator 1, which has a high pass frequency band, is prevented. In addition, the low-pass filter LPF is provided at a single location between the input terminal IN and the input of the second isolator 2 and an increase in insertion loss and an increase in the number of components are suppressed.

Next, an example of a concrete configuration of the first and second isolators 1 and 2 will be described with reference to FIG. 2 and FIG. 3. As illustrated in FIG. 2, the isolators 1 and 2 are mounted on a substrate 20 and each include a ferrite/magnet element 30, which includes a ferrite 32 and a pair of permanent magnets 41, and various chip-type elements.

The first central electrode 35 and the second central electrode 36 are wound around the ferrite 32 so as to be electrically insulated from each other. The permanent magnets 41 are adhered using for example an epoxy-based adhesive 42 (refer to FIG. 3) such that a direct-current magnetic field is applied in a thickness direction to the ferrite 32.

Figure 3:
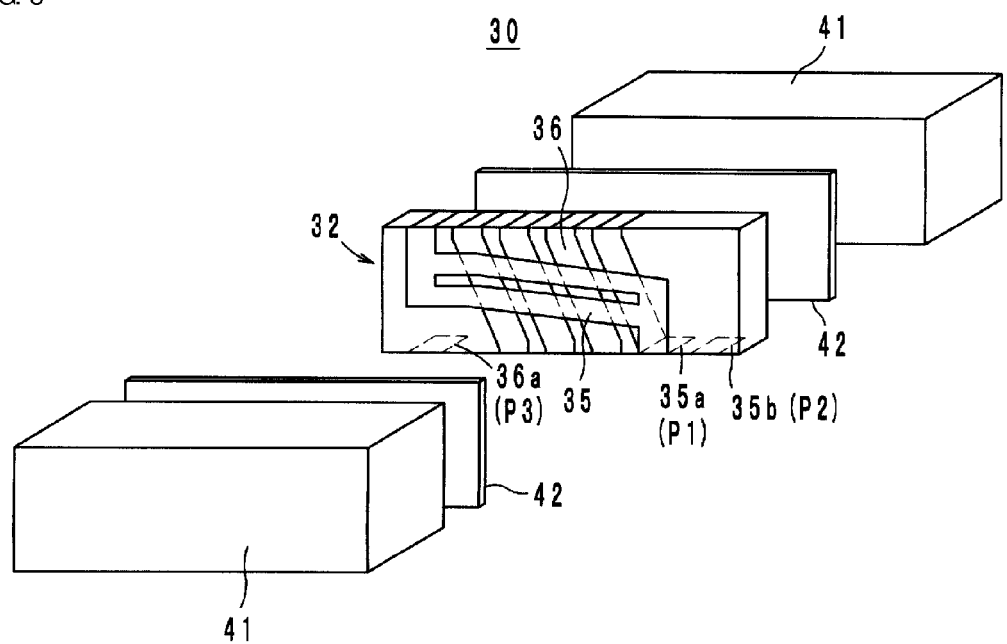
FIG. 3 is an exploded perspective view illustrating a ferrite/magnet element included in each isolator of the non-reciprocal circuit element.

As illustrated in FIG. 3, the first central electrode 35 is wound around the ferrite 32 for one turn, with a one-end electrode 35a thereof defining the input port P1 and an other-end electrode 35b thereof defining the output port P2. The second central electrode 36 is wound around the ferrite 32 for four turns (number of turns may be appropriately chosen) so as to cross over the first central electrode 35 at a certain angle, with the one-end electrode 35a (common to the first central electrode 35) defining the input port P1 and an other-end electrode 36a defining the ground port P3. In FIG. 3, illustration of the electrodes on the back surface side of the ferrite 32 has been omitted to avoid making the figure too complex.

The circuit substrate 20 is a resin substrate preferably formed by stacking resin substrates and conductive foils on top of one another and includes terminal electrodes, which are not illustrated, located on the upper surface thereof. These terminal electrodes are connected through via hole conductors (not illustrated) to external connection terminals IN, OUT1, OUT2 and GND (refer to FIG. 1) located on a lower surface of the circuit substrate 20 and define the equivalent circuit illustrated in FIG. 1.

Figure 4:
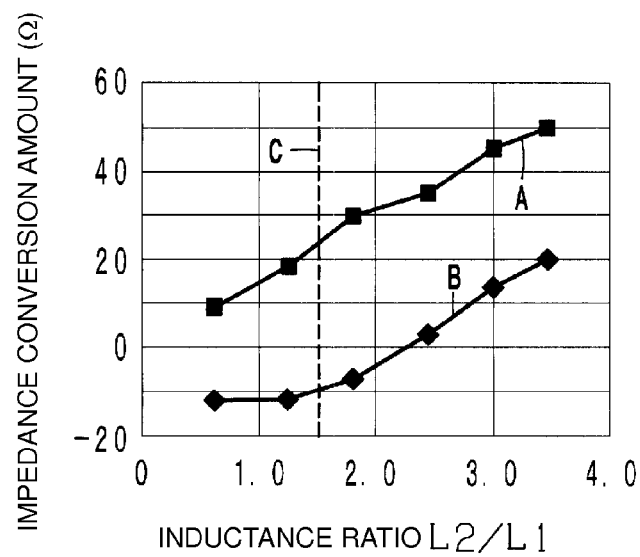
FIG. 4 shows graphs illustrating impedance conversion amounts obtained using the isolator.

Here, an impedance conversion amount between the ports P1 and P2 of the isolators 1 and 2 and an inductance ratio L2/L1 of the first and second central electrodes 35 and 36 will be described. Here, an inductance of the first central electrode 35 is denoted L1 and an inductance of the second central electrode 36 is denoted L2. The relationship between the inductance ratio L2/L1 and the impedance conversion amount between the ports P1 and P2 is illustrated in Table 1 and FIG. 4, which will be described below. The inductance ratio L2/L1 corresponds to a turn ratio of the first and second central electrodes 35 and 36. In FIG. 4, a characteristic curve A represents a real part of the impedance and a characteristic curve B represents an imaginary part of the impedance. A crossing point between a straight line C and the real part characteristic curve A indicates a real-part impedance conversion amount of 25Ω (input of 25Ω, output of 50Ω) in FIG. 1.

TABLE 1

| L2/L1 TURN RATIO | L2/L1 INDUCTANCE RATIO | INPUT IMPEDANCE (Ω) | | OUTPUT IMPEDANCE (Ω) | | IMPEDANCE CONVERSION AMOUNT (Ω) | |
|---|---|---|---|---|---|---|---|
| | | REAL PART | IMAGINARY PART | REAL PART | IMAGINARY PART | REAL PART | IMAGINARY PART |
| 1 | 0.6 | 1.9 | −9.7 | 11.0 | −22.0 | 9.1 | −12.3 |
| 2 | 1.2 | 9.0 | −23.0 | 27.0 | −35.0 | 18.0 | −12.0 |
| 3 | 1.8 | 20.0 | −38.0 | 50.0 | −45.0 | 30.0 | −7.0 |
| 4 | 2.4 | 35.0 | −48.0 | 70.0 | −45.0 | 35.0 | 3.0 |
| 5 | 3.0 | 50.0 | −58.0 | 95.0 | −45.0 | 45.0 | 13.0 |
| 6 | 3.4 | 70.0 | −65.0 | 120.0 | −45.0 | 50.0 | 20.0 |

Figure 9:
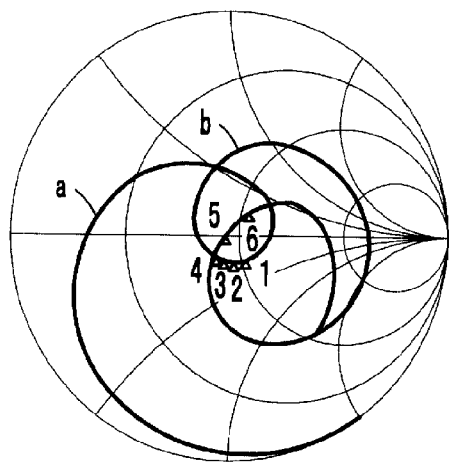
FIG. 9 is a Smith chart illustrating an input matching characteristic of the isolator.
Figure 10:
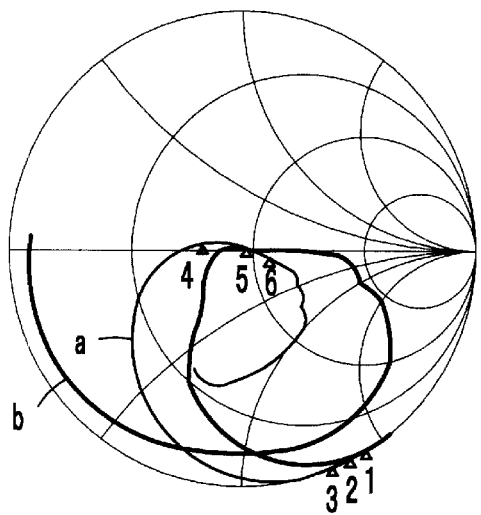
FIG. 10 is a Smith chart illustrating an output matching characteristic of the isolator.

That is, the real and imaginary parts of the impedance conversion amount increase as the inductance ratio L2/L1 increases, and therefore the impedance conversion amount can be adjusted by appropriately setting the number of turns of the first and second central electrodes 35 and 36. The imaginary part of the impedance is adjusted from an arbitrary value to 0Ω using the capacitors CS1H and CS2H. The input impedance conversion characteristic of 25Ω to 50Ω is illustrated in the Smith chart of FIG. 9 and the center is 25+j0Ω. A curve a representing a conversion characteristic of the first isolator 1 and a curve b representing a conversion characteristic of the second isolator 2 almost entirely overlap each other such that they cannot be discriminated from each other. In addition, an output impedance characteristic is illustrated in the Smith chart of FIG. 10 and the center is 50+j0Ω. A conversion characteristic of the first isolator 1 is represented by a curve a and a conversion characteristic of the second isolator 2 is represented by a curve b. Thus, it is clear that there is an impedance conversion function of 25Ω to 50Ω in the bands of 824 MHz to 915 MHz and 1710 MHz to 1980 MHz.

As described above, along with the isolators 1 and 2 having an impedance conversion function of 25Ω to 50Ω, their insertion loss is very low at 0.7 dB. Therefore, as illustrated in FIG. 1, it is sufficient for just a single matching circuit 60 to be interposed between the power amplifier PA, which has an output impedance of 5Ω, and the isolators. In other words, the matching circuit 70 illustrated in FIG. 16 can be omitted. For the first isolator 1, an insertion loss of the matching circuit 60 of 0.3 dB is added to the insertion loss of the first isolator 1 of 0.7 dB, giving a total of 1.0 dB. For the second isolator 2, an insertion loss of the low-pass filter LPF of 0.3 dB and an insertion loss of the matching circuit 60 of 0.3 dB are added to the insertion loss of the second isolator 2 of 0.7 dB, resulting in a total of 1.3 dB.

Second Preferred Embodiment

Figure 11:
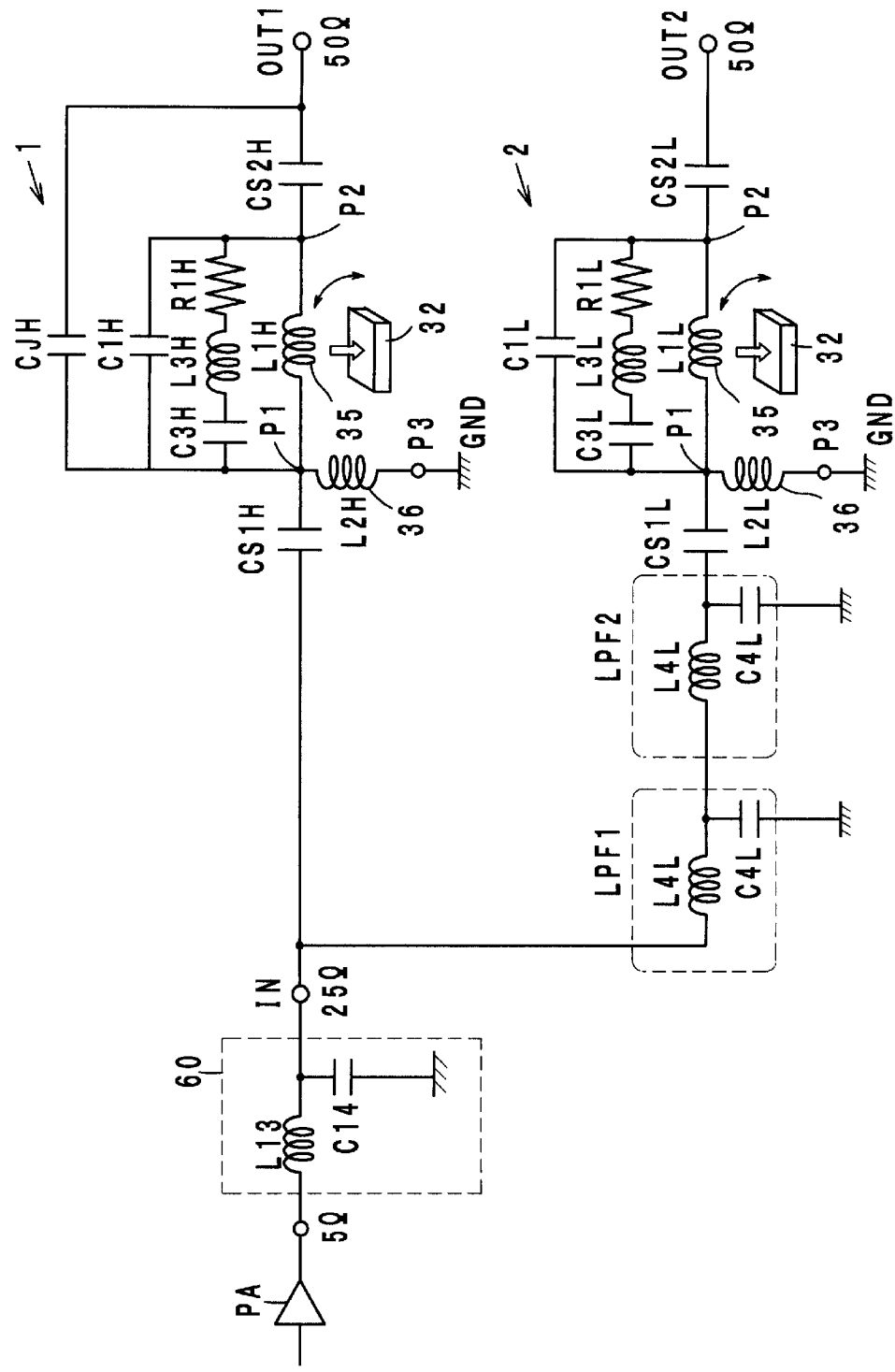
FIG. 11 is an equivalent circuit diagram illustrating a non-reciprocal circuit element of a second preferred embodiment of the present invention.

As illustrated in FIG. 11, a non-reciprocal circuit element of a second preferred embodiment of the present invention basically has the same circuit configuration as that of the first preferred embodiment, but two low-pass filters LPF1 and LPF2 are preferably provided between the input terminal IN and an input of the second isolator 2. These low-pass filters LPF1 and LPF2 are each preferably defined by an L-type resonant circuit including an inductor L4L and a capacitor C4L. The operational effect of the filters is the same as that of the low-pass filter LPF.

The operational effect of the second preferred embodiment is substantially the same as that of the first preferred embodiment. However, the total insertion loss of the second isolator 2 is increased by about 0.3 dB due to the addition of LPF2. On the other hand, the cut off characteristic is improved compared with the first preferred embodiment due to LPF1 and LPF2 and the insertion loss of the first isolator 1 is reduced.

Third Preferred Embodiment

Figure 12:
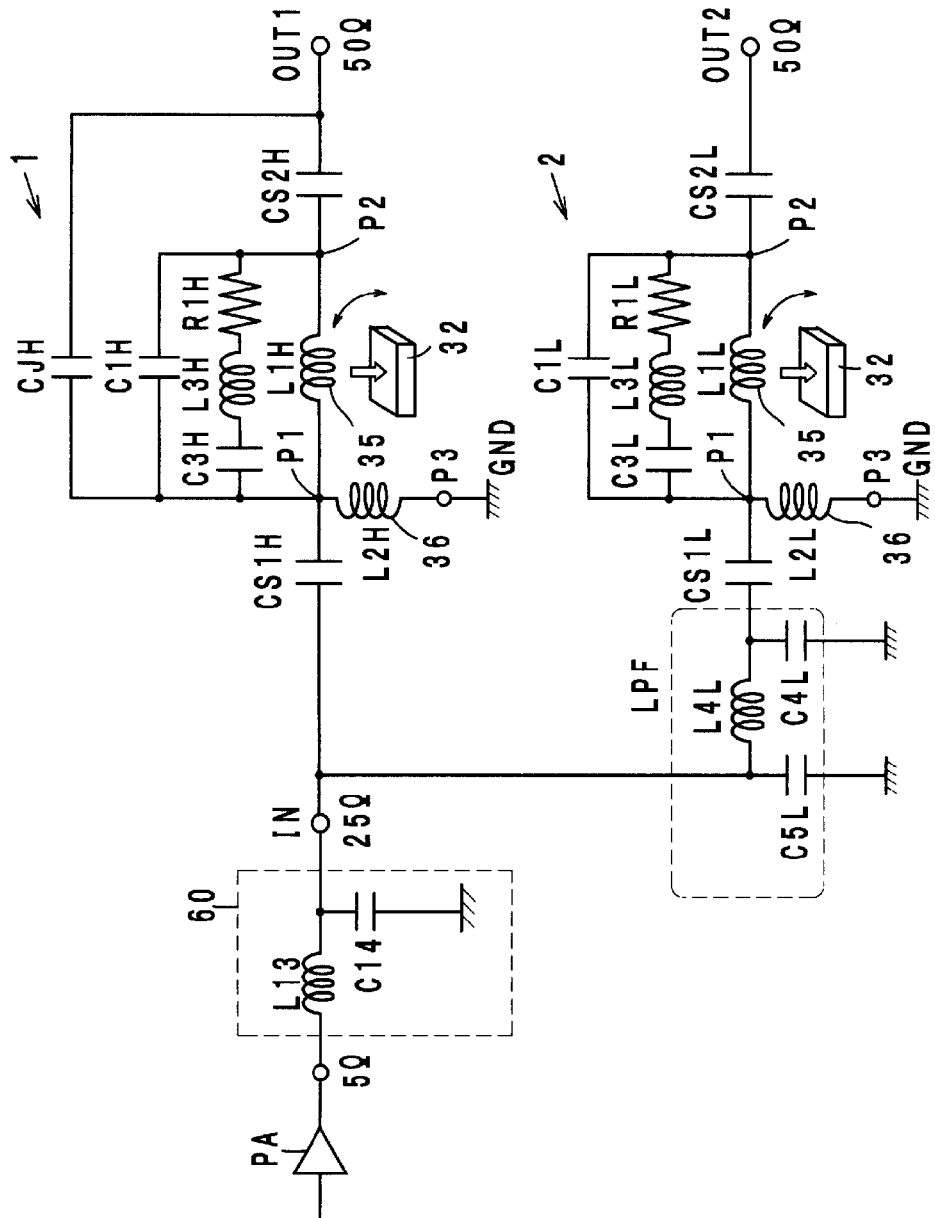
FIG. 12 is an equivalent circuit diagram illustrating a non-reciprocal circuit element of a third preferred embodiment of the present invention.

As illustrated in FIG. 12, a non-reciprocal circuit element of a third preferred embodiment of the present invention basically preferably has the same circuit configuration as that of the first preferred embodiment, but the low-pass filter LPF provided between the input terminal IN and the input of the second isolator 2 is preferably defined by an π-type resonant circuit including an inductor L4L and capacitors C4L and C5L. The operational effect of the π-type low-pass filter LPF is the same as that of the L-type low-pass filter LPF.

The operational effect of the third preferred embodiment is substantially the same as that of the first preferred embodiment. However, the insertion loss of the low-pass filter LPF used with the second isolator 2 is about 0.4 dB and the total insertion loss of the second isolator 2 is about 1.4 dB.

Fourth Preferred Embodiment

Figure 13:
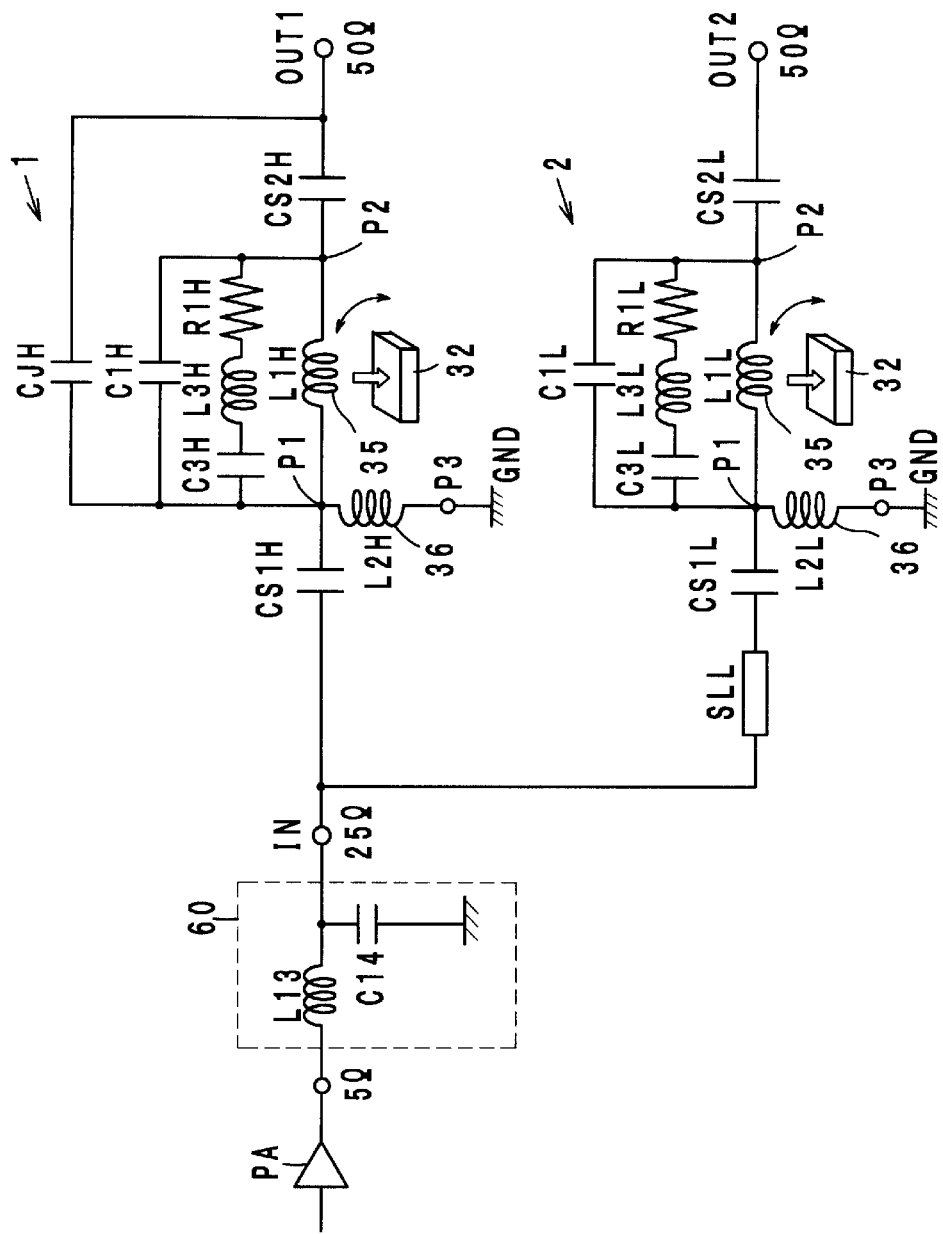
FIG. 13 is an equivalent circuit diagram illustrating a non-reciprocal circuit element of a fourth preferred embodiment of the present invention.

As illustrated in FIG. 13, a non-reciprocal circuit element of a fourth preferred embodiment of the present invention basically has the same circuit configuration as that of the first preferred embodiment, but a stripline SLL is provided between the input terminal IN and an input of the second isolator 2. The stripline SLL defines and functions as a low-pass filter and its operational effect is the same as that of the low-pass filter LPF.

The operational effect of the fourth preferred embodiment is substantially the same as that of the first preferred embodiment. However, the insertion loss of the stripline SLL used with the second isolator 2 is about 0.2 dB and the total insertion loss of the second isolator 2 is about 1.2 dB.

Fifth Preferred Embodiment

Figure 14:
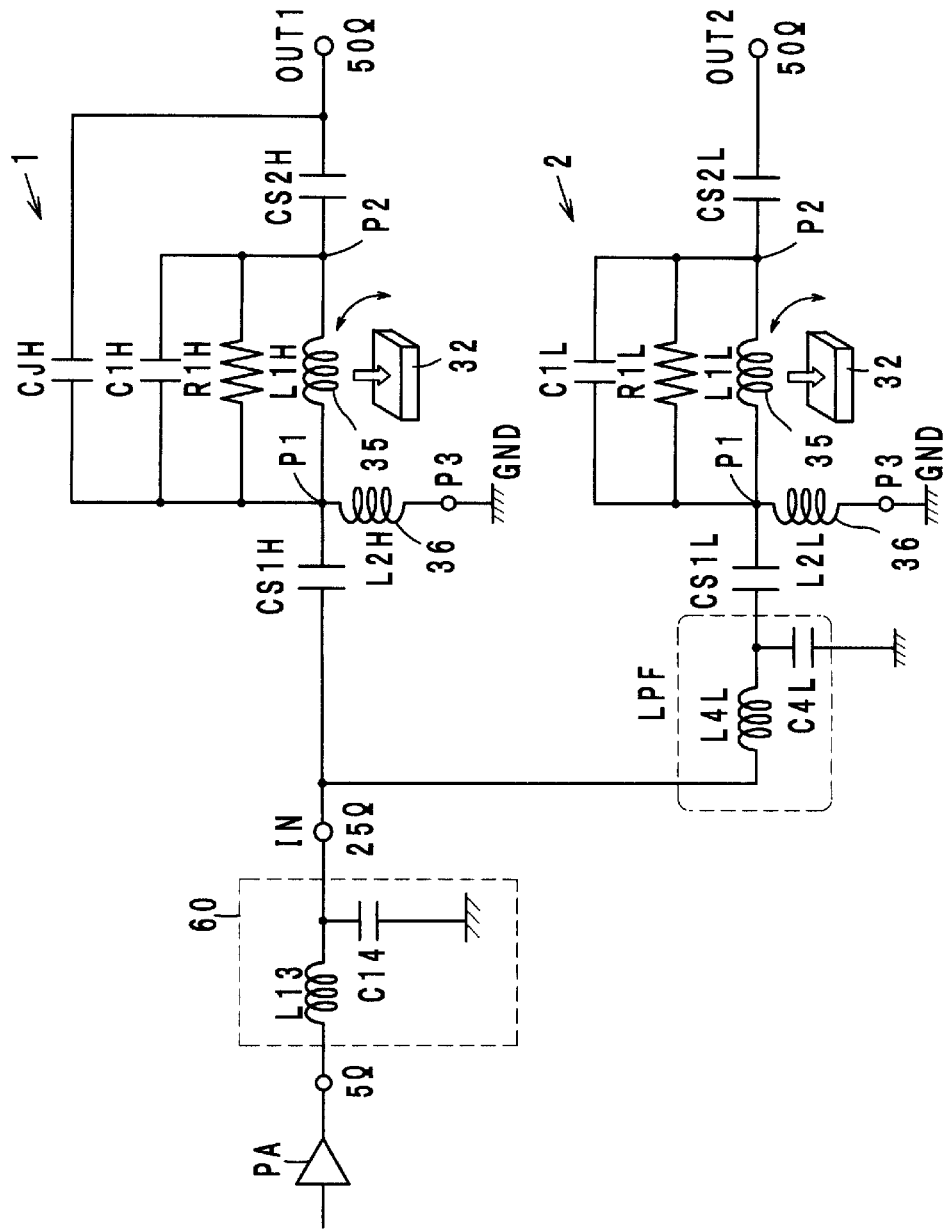
FIG. 14 is an equivalent circuit diagram illustrating a non-reciprocal circuit element of a fifth preferred embodiment of the present invention.
Figure 15:
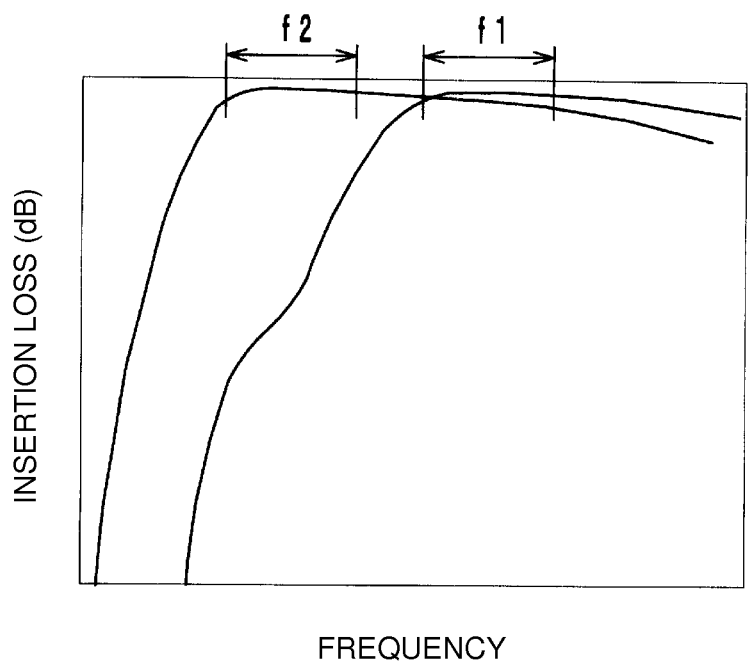
FIG. 15 is a graph illustrating an insertion loss characteristic in the case where a pair of two-port isolators of the related art are combined.

As illustrated in FIG. 14, a non-reciprocal circuit element of a fifth preferred embodiment of the present invention basically has the same circuit configuration as that of the first preferred embodiment but the LC series resonant circuits (inductors L3H, L3L, capacitors C3H, C3L) are omitted from the equivalent circuit illustrated in FIG. 1. The L-type low-pass filter LPF is provided between the input terminal IN and the input of the second isolator 2 and the operational effect is the same as in the first preferred embodiment. The insertion loss also has the same value as in the first preferred embodiment.

Other Preferred Embodiments

A non-reciprocal circuit element according to the present invention is not limited to the above-described preferred embodiments and can be modified within the scope of the gist of the present invention.

For example, the configuration of the ferrite/magnet element 30 and the shapes of the first and second central electrodes 35 and 36 can be modified in various ways. In addition, the capacitance elements and resistance elements may be built into a circuit substrate, which is a multilayer body, rather than being chip components mounted on a circuit substrate.

As has been described above, preferred embodiments of the present invention provide non-reciprocal circuit elements that are particularly excellent in that, as well as being capable of suppressing an increase in the number of components and an increase in insertion loss, the preferred embodiments of the present invention are also capable of realizing a low input impedance and suppressing an increase in the number of components and an increase in cost in a transmission-side circuit.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A non-reciprocal circuit element comprising:
high-pass first and second isolators that are each provided with first and second central electrodes that are arranged on a ferrite so as to cross each other and are insulated from each other, the ferrite being applied with a direct-current magnetic field by permanent magnets, one end of the first central electrode defining an input port and another end of the first central electrode defining an output port, one end of the second central electrode defining the input port and another end of the second central electrode defining a ground port, and a resistance element and a capacitance element, which are connected in parallel with each other, being connected in series between the input port and the output port; wherein
a pass frequency band of the first isolator is higher than a pass frequency band of the second isolator;
inputs of the first and second isolators are electrically connected to each other to define a single input terminal; and
a low-pass filter is provided between the input terminal and the input port of the second isolator.

2. The non-reciprocal circuit element according to claim 1, wherein the low-pass filter is an L-type or n-type filter including an inductor and a capacitor.

3. The non-reciprocal circuit element according to claim 1, wherein two of the low-pass filters are connected.

4. The non-reciprocal circuit element according to claim 1, wherein the low-pass filter includes a stripline.

5. The non-reciprocal circuit element according to claim 1, wherein the first and second isolators are two-port isolators.

6. The non-reciprocal circuit element according to claim 1, further comprising a capacitor provided at the input port.

7. The non-reciprocal circuit element according to claim 1, further comprising a first matching capacitor and a second matching capacitor, wherein the input port is connected to the input terminal via the first matching capacitor, and the output port is connected to the output terminal via the second matching capacitor.

8. The non-reciprocal circuit element according to claim 1, further comprising a matching capacitor connected in parallel with the first central electrode between the input port and the output port, and a resistor and an LC series resonant circuit connected in parallel with the first central electrode.

9. The non-reciprocal circuit element according to claim 1, wherein the low-pass filter includes an n-type resonant circuit including an inductor and capacitors.

10. A cellular phone comprising the non-reciprocal circuit element according to claim 1.

11. The non-reciprocal circuit element according to claim 1, wherein another low-pass filter is provided between the input terminal and the input of the second isolator.

12. The non-reciprocal circuit element according to claim 11, wherein each of the low-pass filter and the another low-pass filter includes an L-type resonant circuit including an inductor and a capacitor.

* * * * *